United States Patent
Franz et al.

(10) Patent No.: US 7,035,096 B2
(45) Date of Patent: Apr. 25, 2006

(54) LOCKING MECHANISM FOR REMOVABLE COMPONENTS

(75) Inventors: John P. Franz, Houston, TX (US); Wade D. Vinson, Magnolia, TX (US); Nicholas Holian, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/698,605

(22) Filed: Oct. 31, 2003

(65) Prior Publication Data
US 2005/0094370 A1 May 5, 2005

(51) Int. Cl.
*G06F 1/16* (2006.01)
(52) U.S. Cl. .................. 361/685; 312/223.1; 312/223.2
(58) Field of Classification Search ........ 361/683–686, 361/695, 724–727, 754, 759, 786, 798, 801, 361/804; 248/552, 553; 312/223.1, 223.2; 70/14, 57, 58, 32–34
See application file for complete search history.

(56) References Cited

U.S. PATENT DOCUMENTS

| 5,454,080 | A | * | 9/1995 | Fasig et al. ................. 710/302 |
| 5,923,541 | A | * | 7/1999 | Yasumi ....................... 361/798 |
| 6,200,146 | B1 | * | 3/2001 | Sarkissian .................... 439/79 |
| 6,310,777 | B1 | * | 10/2001 | Knott .......................... 361/726 |
| 6,728,099 | B1 | * | 4/2004 | Tsang et al. ................. 361/678 |
| 2004/0012921 | A1 | * | 1/2004 | Hidaka et al. ............... 361/685 |

* cited by examiner

*Primary Examiner*—Lynn Feild
*Assistant Examiner*—Anthony Q. Edwards (57) ABSTRACT

According to certain embodiments, the present technique provides a locking mechanism for coupling and uncoupling a removable component coupleable to and uncoupleable from a computing device. The exemplary locking mechanism includes a first member selectively positionable between secured and unsecured configurations of the removable component with respect to the computer device. The exemplary locking mechanism also includes a second member positionable between first and second configurations, wherein the first configuration extends the second member through the first member in the second configuration to secure the first member.

20 Claims, 6 Drawing Sheets

LOCKING MECHANISM FOR REMOVABLE COMPONENTS

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, it should be understood that these statements are to be read in this light, and not as admissions of prior art.

Typical computer devices, such as a desktop computer, a laptop computer, a hand-held computer, a tablet computer, a server, or another mobile or stationary processor-based device, may include a number of removable components. For example, the removable components may comprise floppy disk drives, hard disk drives, optical disk drives, memory modules, communication components, audio components, video components, cooling components (e.g., fans), and so forth. The removable components, however, may not be as securely coupled to the computer device as removable components that are more permanently fastened to the computer device, e.g., screws. During shipment, agitation of the computer device may cause the removable components to uncouple and disengage from the computer device. When received, a consumer may perceive the uncoupled or disengaged removable components as being defective and/or lacking in quality. Moreover, during operation of the computer device, unintended jarring may cause removable components to uncouple or disengage from the computer device, leading to a loss of data, a failure of the computer device, and/or a degradation in the performance of the computer device, to name but a few adverse effects.

Removable components may need to be engaged to or disengaged from the computer device while the computer device is operating. Certain protocols are typically followed prior to engaging or disengaging such removable components to prevent adverse effects. For example, the protocols may suggest engagement and disengagement of the removable component with respect to the computer device when the removable component is in a dormant configuration (e.g., off).

Typically, an operator may not know that engagement or disengagement of a removable component is undesirable. By way of example, the removable component may not provide sufficient tactile feedback to indicate that the removable component is in an operational configuration and, thus, should not be disengaged from the computer device.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

According to certain embodiments, the present technique provides an exemplary locking assembly for a removable component engageable with a computer device. As discussed in further detail below, the exemplary locking assembly comprises a pivotable knob configured to actuate a bolt through a lever, thereby preventing actuation of the lever. In the illustrated embodiments, the lever may be configured to bias the removable component into or out of engagement with the computer device. Accordingly, locking the position of the lever can avoid inadvertent engagement and disengagement of the removable component with respect to the computer device. According to another exemplary embodiment of the present technique, the pivotal motion of the knob may be translated into lateral motion of the bolt. The pivotable knob also may be configured to transition the removable component between operational and dormant configurations. In operation, the locking assembly may also provide tactile feedback to a user to inhibit the inadvertent engagement or disengagement of the removable component with respect to the computer device. That is, the user may feel the interaction between various components locking assembly, thereby informing him that engagement or disengagement of the component may be undesirable.

Figure 1:
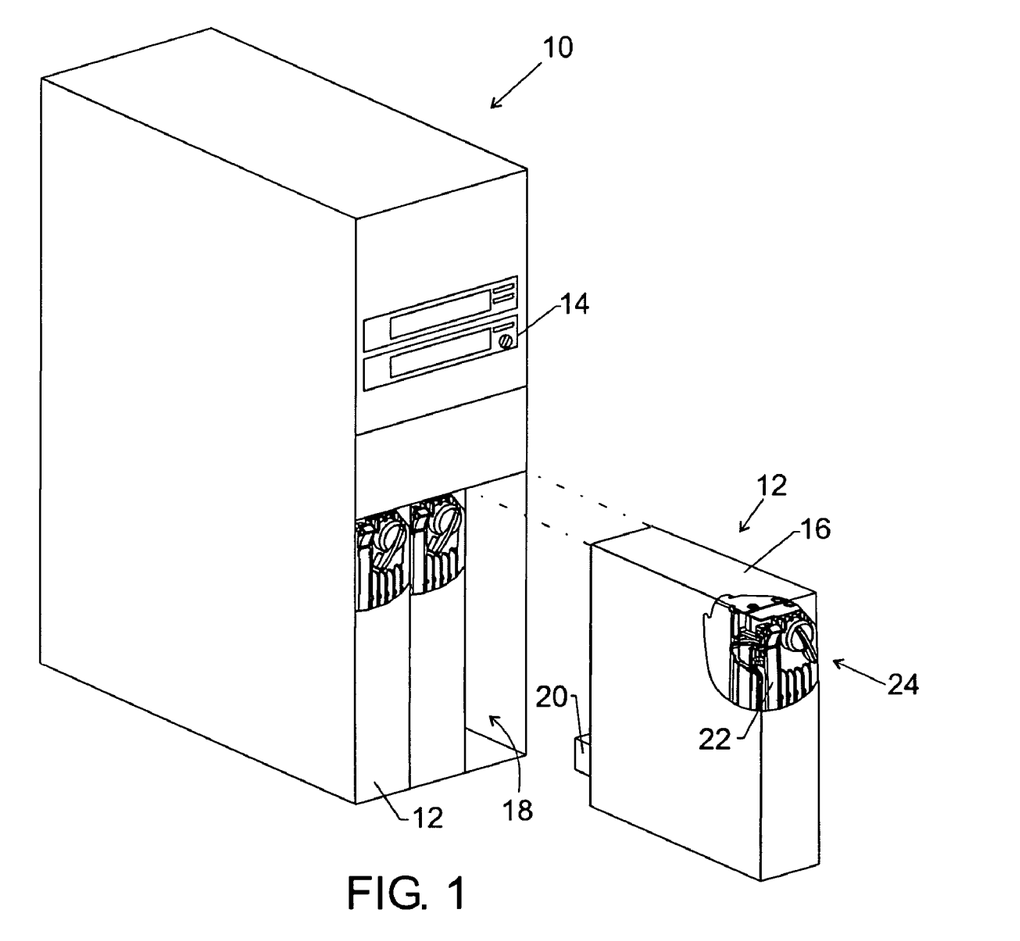
FIG. 1 is a perspective view of a computer device having removable components in accordance with certain embodiments of the present technique.

Turning now to the figures, FIG. 1 illustrates an exemplary computer device 10 incorporating certain aspects of the present technique. The computer device may be any of a number of electronic devices, such as a desktop computer, a laptop computer, a hand-held computer, a tablet computer, a server, or another mobile or stationary processor-based device. The computer device 10 may include any number of removable components 12, such as floppy disk drives 14, optical disk drives, hard disk drives, memory modules, communication components, audio components, video components, cooling components (e.g., fans), and so forth. Advantageously, the removable components 12 may be "hot-pluggable," which means that the removable components 12 may be engaged or disengaged with the computer device 10 while the computer device 10 is operating. The removable components 12 each may include a component housing 16 adapted for mounting in corresponding component bays 18 located throughout the computer device 10. In certain embodiments, the various component bays 18 may provide a relatively snug fit about the removable components 12, thereby ensuring secure mounting and less vibrational motion of the removable components 12.

To facilitate communication between the removable component 12 and the computer device 10, the removable component 12 may include a communication connector 20 that is configured to engage a communication port (not shown) located in the computer device 10, particularly in the component bays 18.

The removable component 12 may also include a biasing mechanism (not shown) configured to bias the removable component 12 to facilitate insertion and extraction of the component into and out of the computer device 10. Actuation of the biasing mechanism may be conducted via a pivotable lever 22 coupled to the removable component 12. By way of example, the biasing mechanism may comprise a rack and pinion assembly, such that movement of the pivotable lever 22 creates leverage between the computer device 10 and the removable component 12. For example, the pinion may be disposed on the pivotable lever 22 and the rack may be disposed on the computer device 10, or vice versa. In this manner, the leverage translated from the pivotable lever 22 to the rack and pinion assembly facilitates engagement or disengagement of the removable component 12 with respect to the computer device 10. This leverage is particularly useful in overcoming engagement and disengagement forces, such as forces between communication connectors and between the removable component 12 and the computer device 10. In the exemplary biasing mechanism, pivotal movement of the lever inwardly with respect to the removable component 12 may bias the removable component 12 into engagement with the computer device 10. Correspondingly, outwardly directed pivotal movement of the lever 22 with respect to the removable component 12 may bias the removable component 12 into a disengaged configuration with respect to the computer device 10. Of course, to the extent that a biasing mechanism is needed, any suitable biasing mechanism may be employed.

Figure 2:
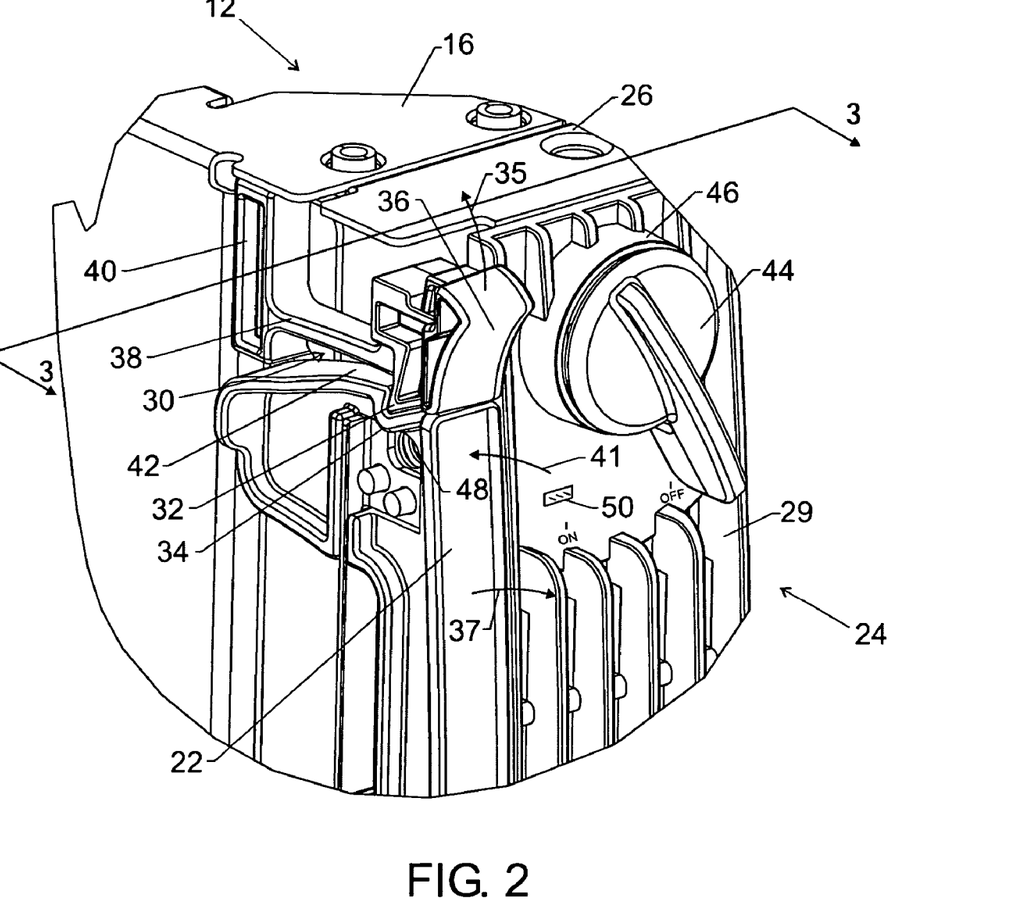
FIG. 2 is a perspective detail view of an unlocked configuration of a removable component locking assembly in accordance with certain embodiments of the present technique.

Advantageously, the removable component 12 also may include a locking assembly 24 that prevents inadvertent actuation of the lever 22, thereby mitigating the risk of inadvertent engagement or disengagement of the removable component 12 with respect to the computer device 10. FIG. 2 illustrates a detailed perspective view of the exemplary locking assembly 24 in accordance with certain aspects of the present technique. As discussed below, the various components of the locking assembly 24 may be mounted to a base plate 26, such as a metallic sheet or other suitable materials. The base plate 26 may be integrally formed with the component housing 16 or may be a discrete element fastened to the component housing 16. Moreover, the lever 22 may be pivotably coupled to the base plate 26. Accordingly, the removability of the base plate 26, the biasing mechanism, and the locking assembly 24 facilitates servicing and replacement of worn or damaged parts. A face plate 29 (e.g., a plastic grill) also can be mounted to the base plate 26 to support a number of components of the locking assembly 24 and to provide desired labels and markings, such as on/off or locked/unlocked.

To prevent an inadvertent release of the lever 22, the locking assembly 24 may include a catch mechanism 30 having a catch 32. In operation, the catch 32 engages a notched portion 34 of the lever 22, thereby inhibiting outwardly directed pivotal motion of the lever 22 with respect to the removable component 12. As a result, the lever 22 cannot operate to disengage the removable component 12 outwardly from the computer device 10. However, the catch 32 may be released from the notched portion 34 by actuation of a catch actuator 36, as indicated by arrow 35. Accordingly, upon disengagement of the catch 32, the lever 22 may be rotated to disengage the removable component 12 from the computer device 10, as indicated by arrow 37.

As further illustrated, the catch mechanism 30 has a resilient beam 38 that couples the catch 32 to a catch base 40, which may be secured to the base plate 26 and/or to the face plate 29. As indicated by arrow 41, inwardly directed pivotal movement of the lever 22 toward the catch mechanism 30 causes the catch 32 to interact with a guide surface 42 located on the top portion of the lever 22. As the catch 32 slides along the guide surface 42, the resilient beam 38 deflects the catch 32 as indicated by arrow 35. Upon reaching the notched portion 34, the catch 32 backs into engagement with the notched portion 34, thereby restricting outwardly directed movement of the pivotable lever 22. Again, the interaction between the catch 32 and the notched portion 34 substantially inhibits disengagement of the lever 22 and, thus, prevents removal of the removable component 12 from the computer device 10.

As discussed further below, to provide more secure retention of the lever 22, the locking assembly 24 may include a bolt mechanism 52 (see FIG. 3). The bolt mechanism 52 may be actuated via a knob 44 disposed in a knob housing 46 disposed in the front plate 29. In operation, pivotal actuation of the knob 44 moves the bolt mechanism 52 through a lever aperture 48 located in the lever 22. FIG. 2 illustrates the exemplary bolt mechanism 52 (see FIG. 3) and the knob 44 in an unlocked configuration, which has the bolt mechanism 52 disengaged from the lever 22. In this disengaged position, the bolt mechanism 52 does not inhibit pivotal movement of the lever 22. Thus, the removable component 12 may be engaged to or disengaged from the computer device 10. If the catch 32 is also disengaged from the notched portion 34, then the lever 22 can be pivoted to leverage the removable component 12 into and out of computer device 10.

The knob 44 also may be configured to transition the removable component 12 between dormant and operational configurations. For example, the knob 44 may be configured to toggle communication and/or electrical connections from the removable component 12 to the computer device 10 via immediate on/off switches or controlled on/of processes. In the illustrated embodiment of FIG. 2, the unlocked configuration of the knob 44 corresponds to the dormant configuration of the computer device 10. Accordingly, as the bolt mechanism 52 (see FIG. 3) and the knob 44 are moved to the unlocked configuration, the exemplary removable component 12 transitions to the dormant configuration via either immediate shutdown or controlled shutdown, for example. The controlled shutdown may involve a control signal, which initiates a controlled completion of running processes associated with the removable component 12 followed by an actual shutdown. Moreover, to indicate visually whether the removable component 12 is in an operational or dormant configuration, an indicator light 50 may be located in the front plate 29.

Figure 3:
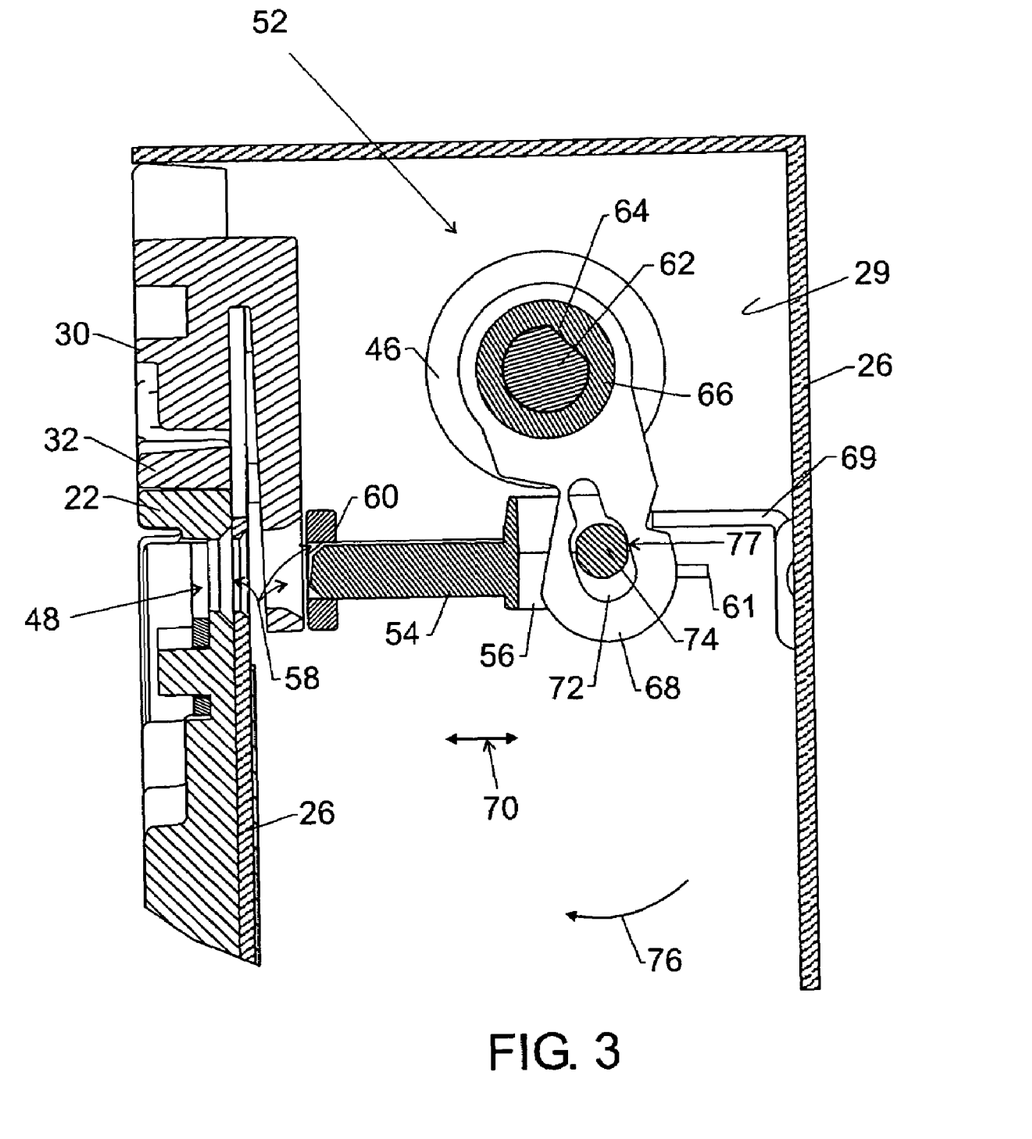
FIG. 3 is a cross-sectional view of the locking assembly of FIG. 2 along line 3—3 illustrating a number of the internal components of the locking assembly in accordance with certain embodiments of the present technique.

FIG. 3 is a cross-sectional view of the locking assembly 24 of FIG. 2 illustrating details of the bolt mechanism 52 in the unlocked configuration. The exemplary bolt mechanism 52 comprises a bolt 54 secured to a bolt carrier 56. In the unlocked configuration of FIGS. 2 and 3, the bolt 54 is disengaged from the lever aperture 48 and, thus, the bolt 54 does not inhibit movement of the lever 22. Upon release of the catch mechanism 30, the lever 22 is free to pivot outwardly in a manner providing leverage to bias the removable component 12 out of the computer device 10. Alternatively, the lever 22 is free to pivot inwardly in a manner facilitating engagement of removable component 12 with the computer device 10 (see FIG. 1). As discussed above, as the bolt mechanism 52 is moved to the unlocked configuration, the removable component 12 may be immediately switched or controllably transitioned to the dormant configuration. As a result, the dormant configuration mitigates the risk of damage to the removable component 12 during engagement and disengagement with computer device 10.

However, upon actuation of the bolt mechanism 52 to a locked configuration, as discussed further below, the bolt 54 may be positioned to extend through a plurality of aligned apertures 58. More particularly, when actuated to the locked configuration, the bolt mechanism 52 may extend the bolt 54 through apertures 58 located in a guide member 60, the catch mechanism 30, the base plate 26, and through the lever aperture 48. The illustrated guide member 60 and guide rail 61 function to support and control movement of the bolt 54 and the bolt carrier 56 within the locking assembly 24. For example, the guide member 60 and guide rail 61 ensure linear movement of the bolt 54 into and out of the apertures 58 and the lever aperture 48.

In the exemplary embodiment, the knob 44 (see FIG. 2) may control actuation of the bolt mechanism 52, such that pivotal movement of the knob 44 moves the bolt 54 laterally through the apertures 58. As illustrated, the bolt mechanism 52 comprises a shaft 62 coupled to the knob 44 (see FIG. 2), a pawl 64 disposed about the shaft 62 and secured via a flattened region 66, and a linkage member 68 disposed about and extending from the pawl 64 to the bolt 54. Accordingly, rotation of the knob 44 provides a corresponding rotation of the shaft 62, pawl 64 and linkage member 68, which translates the rotational motion into linear motion of the bolt 54 along the guides 60 and 61. It should be noted that these components may be integral or an assembly of parts, as illustrated. The bolt mechanism 52 also may have a cantilevered stop member 69 secured to the base plate 26 and/or the face plate 29 opposite to the guide member 60 to set a desired range of rotational motion of the knob 44, the shaft 62, and the pawl 64. In addition, the cantilevered stop member 69 and the guide member 60 also set a desired range of linear motion of the bolt mechanism 52.

Turning to specific details of the exemplary bolt mechanism 52, the guides 60 and 61 set a linear path of motion for the bolt 54, as indicated by arrows 70. Accordingly, the pivotal motion of the linkage member 68 may be translated into lateral motion of the bolt 54 via engagement between a slot 72 located in the linkage member 68 and a circular lug 74 that extends from the bolt carrier 56. In operation, the pivotal actuation of the linkage member 68 may cause the outer periphery of the slot 72 to engage the lug 74. As represented by arrow 76, pivotal actuation of the linkage member 68 in the clockwise direction may cause the slot 72 to place a laterally directed force 77 on the lug 74. This laterally directed force 77 may push against the lug 74, causing the bolt carrier 56 and the bolt 54 to travel through the apertures 58 and 48 to a locked configuration.

Figure 4:
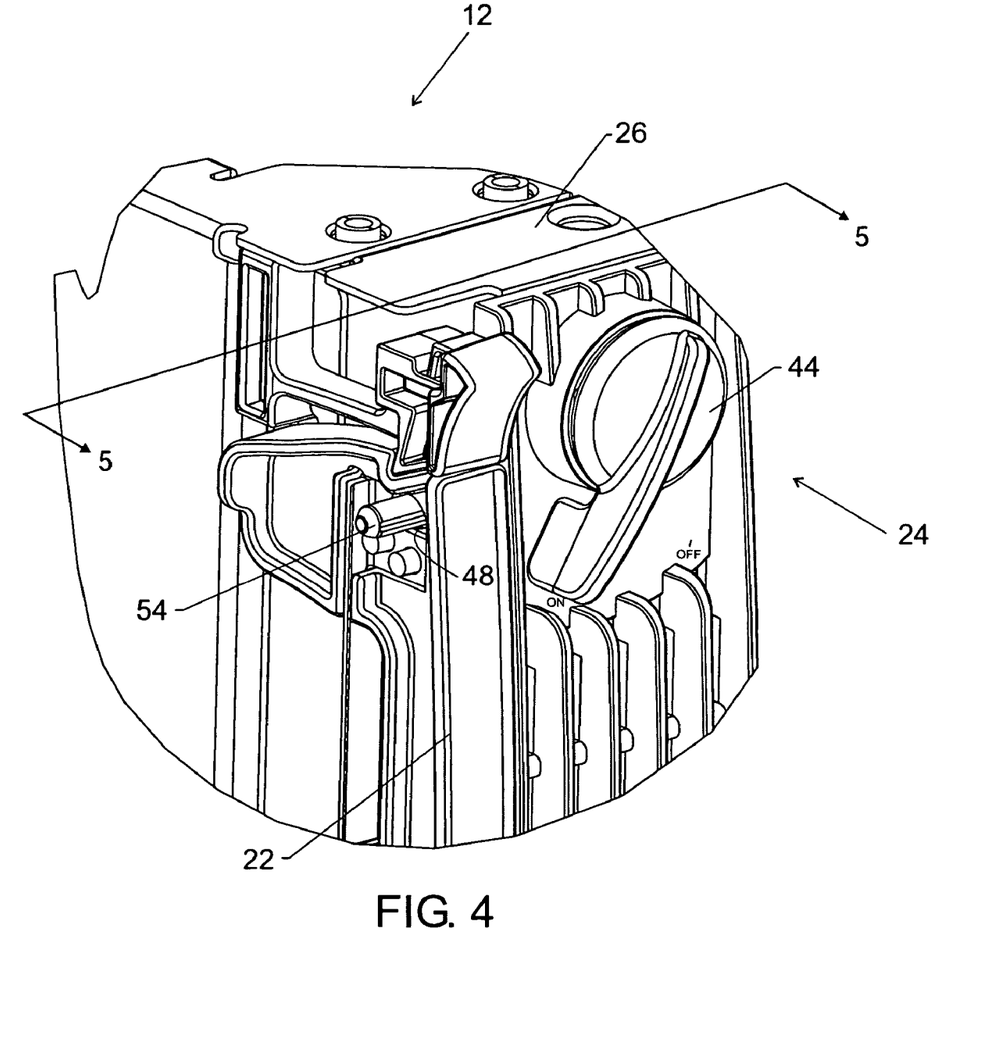
FIG. 4 is a detailed perspective view of a locked configuration of the locking assembly of FIG. 2 in accordance with certain embodiments of the present technique.
Figure 5:
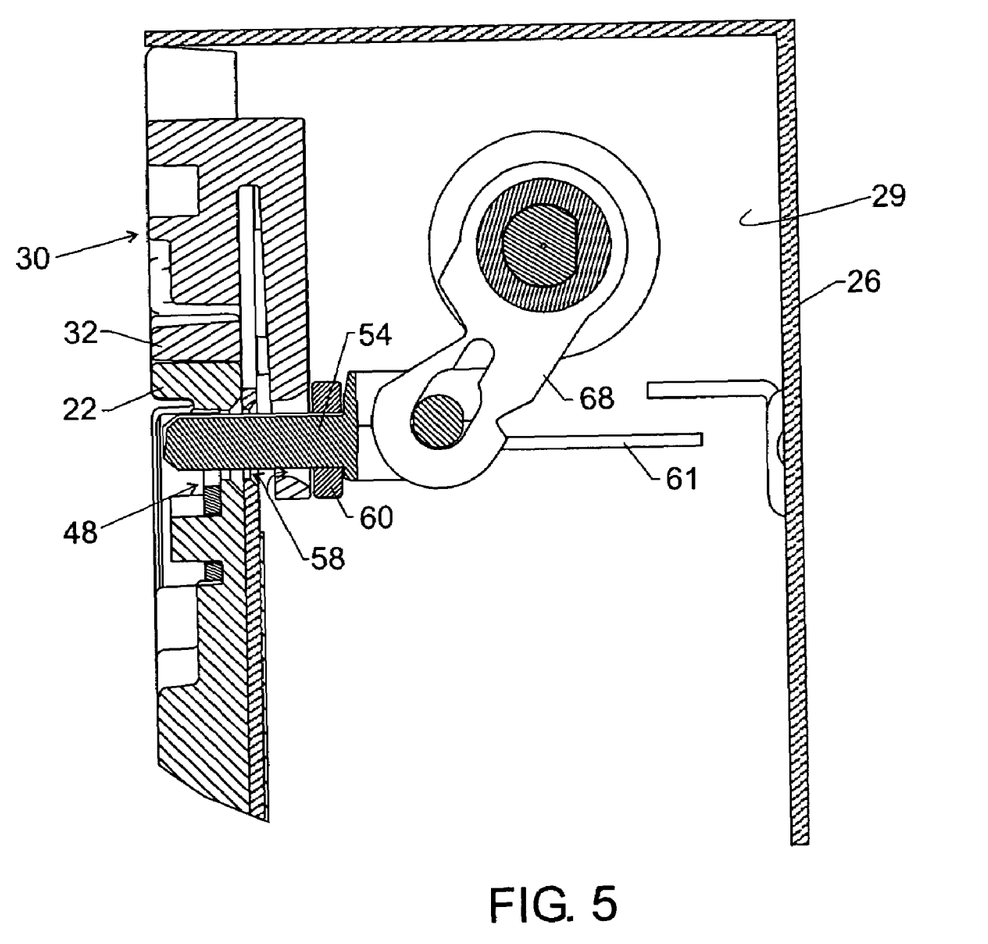
FIG. 5 is a cross-sectional view of the locking assembly of FIG. 4 along line 5—5 in accordance with embodiments of the present technique.

FIGS. 4 and 5 illustrate the bolt positioned through the apertures 58 and 48 in the locked configuration. In this locked configuration, the lever 22 of the exemplary locking assembly 24 is secured, such that the lever 22 is neither inwardly nor outwardly pivotable. Accordingly, the locked configuration of the bolt 54 and the lever 22 inhibits removal of the removable component 12 from the computer device 10. With respect to the orientation of FIG. 5, further rotational movement of the knob 44, the linkage member 68, and the intermediate components may be restricted by abutment of the bolt 54 with the guide member 60. Moreover, linear movement of the bolt 54 may be restricted by engagement of the guide member 60 with the bolt 54. Advantageously, the slot 72 may be elongated in shape to accommodate displacement of the lug 74 within the slot 72 caused by the accurate path of travel of the linkage member 68 and corresponding slot 72.

Furthermore, when the bolt 54 and the knob 44 are disposed in the locked configuration illustrated in FIGS. 4 and 5, the removable component 12 may be set in an operational configuration. Accordingly, the removable component 12 may be transitioned to the operational configuration after moving the locking assembly 24, the bolt mechanism 52, and/or the knob 44 into the locked configuration, as exemplified in FIGS. 4 and 5. Once physically locked, the knob 44 triggers a change from the dormant to the operational configurations. The removable component remains in the operational configuration until the knob 44 moves the bolt 54 away from the locked configuration to an unlocked configuration, at which time the removable component 12 is transitioned to the dormant configuration.

Figure 6:
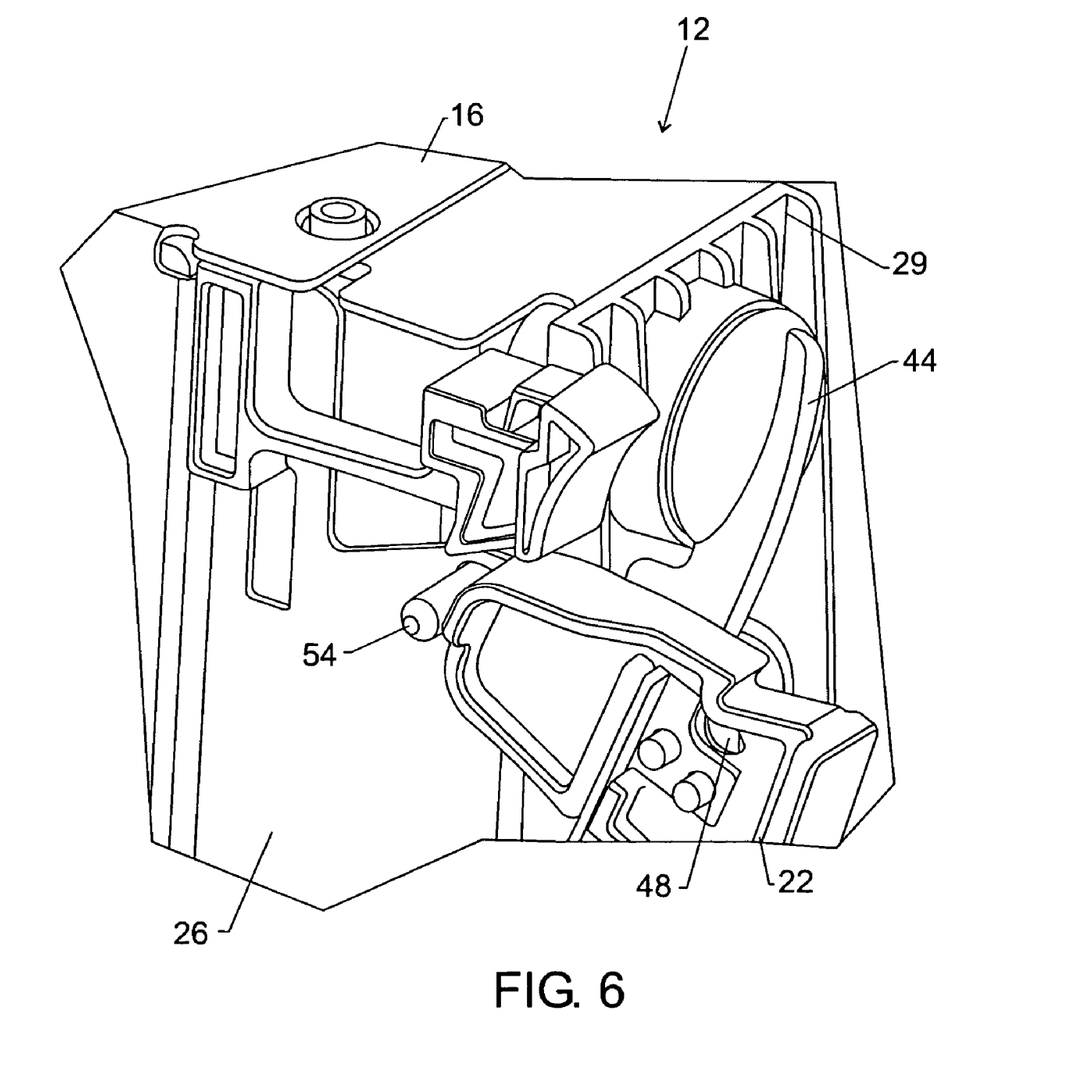
FIG. 6 is a detailed perspective view of an engagement-restricting configuration of the exemplary locking assembly of FIG. 2 in accordance with certain embodiments of the present technique.

Furthermore, as illustrated in FIG. 6, the locking assembly 24 may prevent engagement between the removable component 12 and the computer device 10 when the knob 44 and the bolt 54 are disposed in the locked and operational configuration. For example, the protruding bolt 54 may prevent insertion of the removable component 12 into the computer device 10, while also disabling full movement of the lever 22 into the locked configuration. Accordingly, when in the locked configuration, the bolt 54 also may prevent inwardly directed pivotal movement of the lever 22, thereby preventing the biasing mechanism from facilitating engagement of the removable component 12 with the computer device 10. In addition, the extended bolt 54 may interfere with the pivotal path of travel of the lever 22, thereby preventing the application of the insertion forces used to engage the removable component 12 with the computer device 10. Accordingly, the locking assembly 24 ensures that the removable component 12 cannot be inadvertently engaged with the computer device 10 in the operational configuration, which could cause damage to the removable component and/or the computer device 10.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A locking mechanism for coupling and uncoupling a removable component coupleable to and from a computer device, comprising:
   a first member selectively positionable between secured and unsecured configurations of the removable component with respect to the computer device;
   a second member positionable between first and second configurations, wherein the first configuration extends the second member through the first member in the secured configuration to secure the first member; and a pivotable member configured to actuate the second member selectively between the first and second configurations, wherein the pivotable member is configured to transition the removable component between an operational configuration and a dormant configuration.

2. The locking mechanism as recited in claim 1, wherein the removable component is a hot-pluggable device.

3. The locking mechanism as recited in claim 1, wherein the first member comprises a lever pivotably coupled to the removable component.

4. The locking mechanism as recited in claim 1, wherein the pivotable member is a knob coupled to the removable component.

5. The locking mechanism as recited in claim 1, wherein the dormant configuration is an unpowered configuration and the operational configuration is a powered configuration.

6. A locking mechanism for coupling and uncoupling a removable component coupleable to and from a computer device, comprising:
    a leveraging member configured to at least partially disengage a removable component with respect to a computer device;
    an engaging member selectively positionable in first and second positions such that the engaging member at least partially engages with the leveraging member in the first position; and
    a pivotable member coupled to the engaging member such that pivotal movement of the pivotable member actuates the engaging member along a longitudinal axis of the engaging member, wherein the pivotable member is configured to transition the removable component or the computer device or any combination thereof between an operational configuration and a dormant configuration.

7. The locking mechanism as recited in claim 6, wherein the pivotable member is electrically coupled to an indicator configured to indicate visually the status of at least one of the computer device and removable component between the operational and dormant configurations.

8. The locking mechanism as recited in claim 6, wherein the pivotable member and the leveraging member are coupled to the removable component.

9. The locking mechanism as recited in claim 6, wherein the engaging member in the first position extends through the leveraging member.

10. A system, comprising:
    a computer device;
    a removable component engageable and disengageable with the computer device; and
    a locking assembly, comprising:
        a first member for at least partially disengaging the removable component with respect to the computer device;
        an engaging member positionable between first and second configurations, wherein the engaging member in the first configuration extends through the first member to secure the first member with respect to the computing component; and
        a pivotable member coupled to the engaging member such that pivotal movement of the pivotable member actuates the engaging member along a longitudinal axis of the engaging member, wherein the pivotable member is configured to transition the removable component or the computer device or any combination thereof between an operational configuration and a dormant configuration.

11. The system as recited in claim 10, wherein the computer device comprises a server.

12. The system as recited in claim 10, wherein the computer device comprises a personal computer.

13. The system as recited in claim 10, wherein the removable component comprises a memory component.

14. The system as recited in claim 10, wherein the removable component comprises a disk-drive.

15. The system as recited in claim 10, wherein the removable component comprises a cooling device.

16. The system as recited in claim 10, wherein at least one of the first member and the engaging member is coupled to the removable component.

17. The system as recited in claim 10, wherein the removable component is hot-pluggable.

18. A method of selectively securing a removable component to a computer device, comprising:
    actuating a locking mechanism such that the locking mechanism actuates an engaging member to extend through a first pivotable member configured to selectively position the removable component between secured or unsecured configurations with respect to the computer device; and
    actuating a second pivotable member to actuate the locking mechanism, wherein actuation of the second pivotable member transitions the computer device or the removable component or any combination thereof between a dormant state and an operational state.

19. The method as recited in claim 18, wherein actuation comprises translating the pivotal movement of the pivotal member into lateral movement of the engaging member along a longitudinal axis of the engaging member.

20. A locking mechanism for coupling and uncoupling a removable component with respect to and from a computer device, comprising:
    a first member positionable to transition the removable component between inserted and released positions with respect to the computer device; and
    a second member positionable to transition the removable component between dormant and operational states, wherein placement of the second member in a position such that the removable component is in the operational state blocks the first member from transitioning the removable component between the inserted and released positions.

\* \* \* \* \*